United States Patent [19]
Tachigori

[11] Patent Number: 6,014,061
[45] Date of Patent: Jan. 11, 2000

[54] FRONT-END AMPLIFICATION CIRCUIT

[75] Inventor: Masashi Tachigori, Tokyo, Japan

[73] Assignee: NEC Corporation, Tokyo, Japan

[21] Appl. No.: 09/256,316

[22] Filed: Feb. 24, 1999

[30] Foreign Application Priority Data

Mar. 4, 1998 [JP] Japan ................... 10-051607

[51] Int. Cl.[7] .................. H03F 3/08; H01J 40/14
[52] U.S. Cl. ........................ 330/308; 250/214 A
[58] Field of Search ................. 330/308, 110; 250/214 A, 214 LA, 214 AG, 214 R

[56] References Cited

U.S. PATENT DOCUMENTS

| | | | |
|---|---|---|---|
| 4,563,656 | 1/1986 | Baum | 330/308 |
| 5,525,929 | 6/1996 | Nagahori et al. | 330/308 |
| 5,574,404 | 11/1996 | Le Bars | 250/214 A |
| 5,606,277 | 2/1997 | Feliz | 250/214 LA |

FOREIGN PATENT DOCUMENTS

| | | |
|---|---|---|
| 64-89632 | 4/1989 | Japan . |
| 2-82804 | 3/1990 | Japan . |
| 2-278906 | 11/1990 | Japan . |

*Primary Examiner*—Robert Pascal
*Assistant Examiner*—Patricia T. Nguyen
*Attorney, Agent, or Firm*—McGinn & Gibb, P.C.

[57] ABSTRACT

Output current of light receiving element Dph is converted into a voltage by a core amplification section, and the voltage output is extracted as an amplification output through an outputting circuit section. The output voltage is fed back to the base of transistor T2 of a differential circuit of the core amplification section, by which it is compared with base reference voltage Vref of transistor T1. When the input current is low, the gain of the core amplification section is dominated by the product of the current flowing through transistor T2 and resistor R4, but when the input current is high, the gain is dominated by the product of current flowing through transistor T1 and resistor R3. Consequently, if resistor R3 is set lower than resistor R4, then when the input current is high, the gain margin indicating a degree of stability of the feedback circuit can be made large, and this stabilizes operation of the front-end amplification circuit.

30 Claims, 8 Drawing Sheets

FIG.10 a
FRONT-END AMPLIFICATION CIRCUIT

BACKGROUND OF THE INVENTION

1. Field of the Invention

This invention relates to a front-end amplification circuit, and more particularly to a preamplifier of the transimpedance type for an optical receiver for use with an optical transmission system.

2. Description of the Related Art

Figure 1:
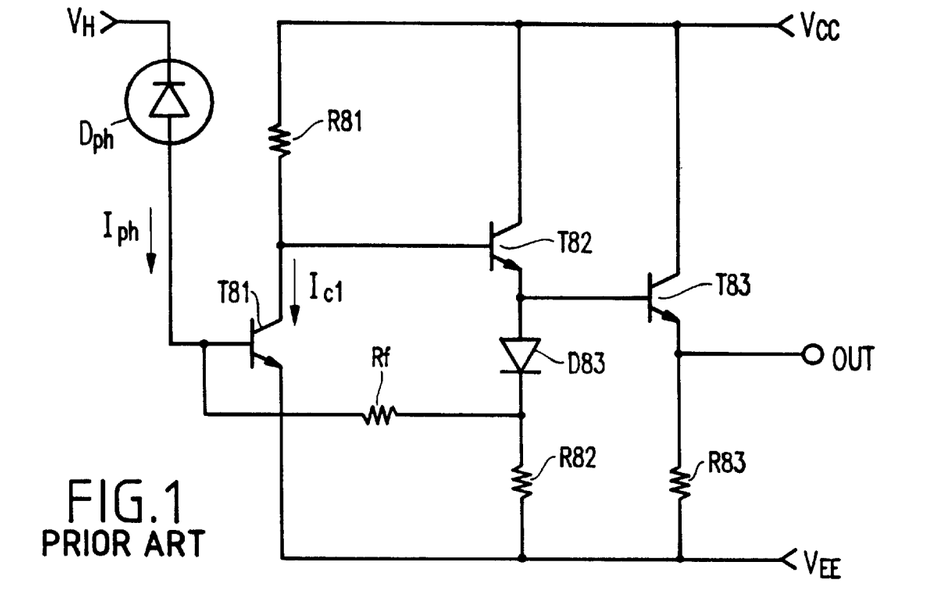
FIG. 1 is a circuit diagram showing an example of a conventional front-end amplification circuit.

Several examples of a conventional transimpedance type preamplifier of the type described above are disclosed in Japanese Patent Laid-Open Nos. 89632/1989, 82804/1990, 278906/1990 and so forth. An exemplary circuit construction of a conventional preamplifier is shown in FIG. 1. Referring to FIG. 1, an optical signal is converted into photo-current Iph by light receiving element Dph, and photo-current Iph flows through feedback resistance element Rf connected to the base of input stage emitter-grounded transistor T81, which composes a front-end amplification circuit, into the front-end amplification circuit, by which it is converted into a voltage. The conversion voltage is extracted as output OUT from output stage emitter follower transistor T83.

The collector output of emitter-grounded transistor T81 in the input stage is supplied as a base input to collector-grounded transistor T82, whose emitter output is supplied as a base input to output stage emitter follower transistor T83. Here, diode D83 to the emitter of transistor T82 has a level shifting function. Reference symbol R81 denotes a collector resistor to transistor T81, R82 an emitter resistor to transistor T82, and R83 an emitter resistor to transistor T83.

In the front-end amplification circuit shown in FIG. 1, as photo-current Iph increases, the voltage drop by feedback resistance element Rf increases, and the potential at a junction between diode D83 and feedback resistance element Rf approaches low power supply potential VEE. In this instance, collector current Ic1 of transistor T81 operates in an increasing direction. If collector current Ic1 increases until collector-emitter voltage VCE of transistor T81 is saturated by the voltage drop by resistor R81, then the entire circuit does not operate regularly.

Figure 2:
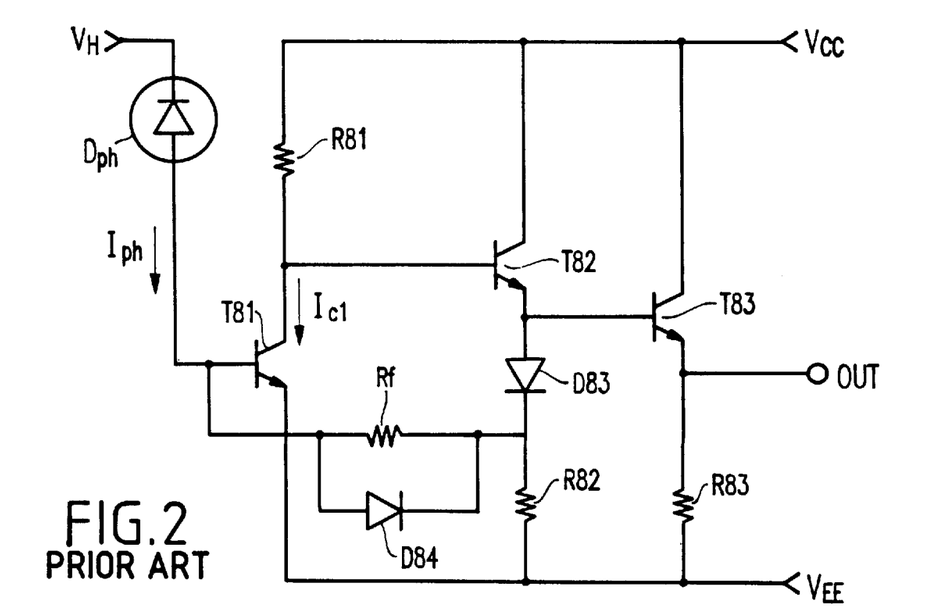
FIG. 2 is a circuit diagram showing another example of a conventional front-end amplification circuit.

As a method for preventing the saturating operation, a method is available wherein, as shown in FIG. 2, diode D84 for limiting the voltage drop is connected in parallel to feedback resistance element Rf. It is to be noted that, in FIG. 2, like elements to those of FIG. 1 are denoted by like reference symbols, and the circuit shown in FIG. 2 is same as the circuit of FIG. 1 except that it additionally includes diode D84 mentioned above.

In the circuit of FIG. 2, when the relationship between photo-current Iph and the voltage drop of feedback resistance element Rf comes to satisfy the following expression:

$$Rf \times Iph > Vf(D84)$$

forward voltage Vf(D84) of diode D84 becomes dominant, and the dropping voltage is limited by this forward voltage Vf(D84).

However, such a circuit construction as described above has the following drawback. In particular, since the voltage drop when the input power is high becomes fixed, from a point of view of circuit operation, it is considered that feedback resistance value Rf becomes lower equivalently. This is likely to give rise to unstable operation of the feedback circuit.

Figure 3A:
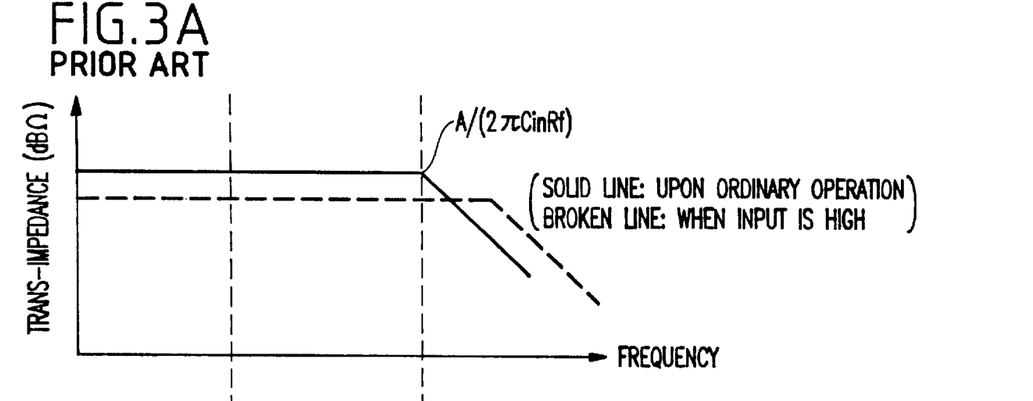
FIGS. 3A, 3B and 3C are diagrams showing a frequency characteristic (transimpedance characteristic), an open loop gain band characteristic, and a no-feedback gain band characteristic of a core amplification section (transistors T81, T82) of a conventional circuit, respectively.
Figure 3B:
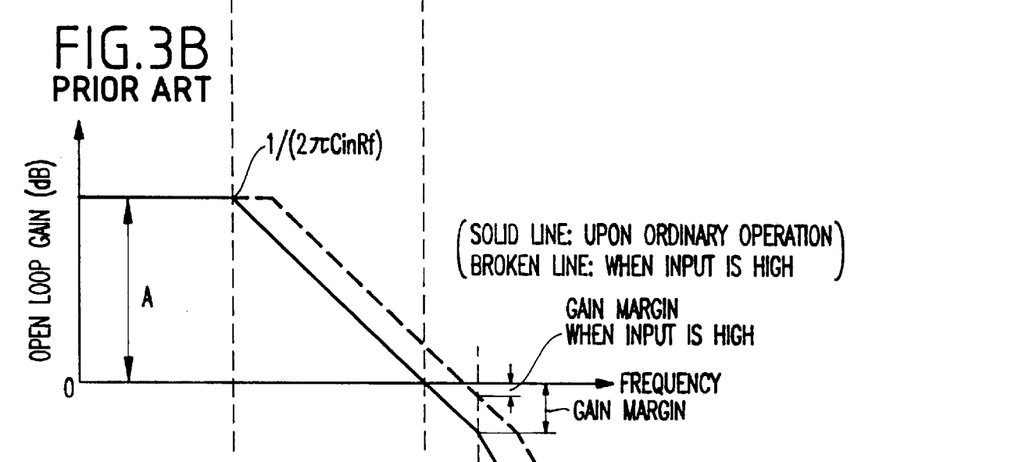
Figure 3C:
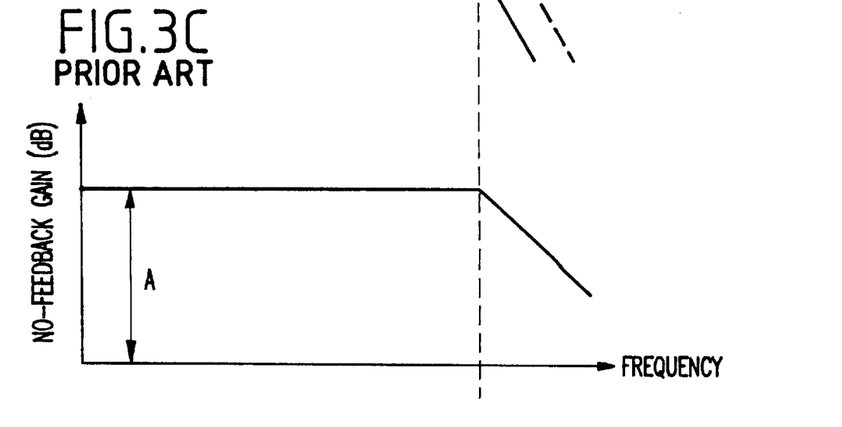

In FIGS. 3A to 3C, a frequency characteristic (transimpedance characteristic) (FIG. 3A) of this circuit, an open loop gain band characteristic (FIG. 3B), and a no-feedback gain band characteristic (FIG. 3C) of a core amplification section (transistors T81, T82). In FIG. 3, reference symbol A denotes an open loop gain in a low frequency band, and Cin denotes an input capacitance value in the input stage of the core amplification section.

As seen from FIG. 3C, a gain margin at a frequency of a primary pole of a no-feedback gain is an index indicating a degree of stability of the feedback circuit. However, when feedback resistance element Rf decreases equivalently, the zero-cross point of the open loop gain shifts to the higher frequency band side in accordance with $A/2\pi \cdot Cin \cdot Rf$ and approaches the primary pole of the no-feedback gain band. Consequently, the gain margin is reduced to zero and a condition in which oscillation is very likely to occur is entered.

Further, since light receiving element Dph is connected to the base of input stage transistor T81, a capacitance component originating from light receiving element Dph is added. Consequently, the circuit construction of FIG. 2 is disadvantageous in that the addition of the capacitance component has a bad influence on the band characteristic and the noise characteristic of the front-end amplification circuit.

SUMMARY OF THE INVENTION

It is an object of the present invention to provide a front-end amplification circuit which suppresses a saturating operation thereof when the input power is high and a gain margin which indicates a degree of stability of a feedback circuit can be increased to allow a normally stable receiving operation.

According to the present invention, there is provided a front-end amplification circuit, comprising an emitter-grounded transistor to a base of which an output of a light receiving element is supplied, a collector-grounded transistor to a base of which an output of a collector of the emitter-grounded transistor is inputted, a feedback resistor for feeding back an output of the collector-grounded transistor to the base of the emitter-grounded transistor, an outputting circuit for extracting an output voltage corresponding to an output of an emitter of the collector-grounded transistor, and differential circuit operating as a load to the collector of the emitter-grounded transistor, the differential circuit including differential pair transistors whose collector resistors are set so as to have different resistance values from each other, a reference voltage being supplied to one of a pair of differential inputs of the differential circuit while a voltage corresponding to the output voltage is supplied to the other of the differential inputs of the differential circuit.

The differential circuit may include differential pair transistors whose emitters are connected in common, and the reference voltage may be supplied to one of the bases of the differential pair transistors while the output voltage of the outputting circuit is supplied to the other base of the differential pair transistors. The resistance value of the resistor provided for the collector of the transistor to which the reference voltage is supplied may be selected lower than the resistance value of the resistor provided for the collector of the other transistor.

The differential circuit may further include resistors provided between emitters of the differential pair transistors and the collector of the emitter-grounded transistor. As the transistors, field effect transistors may be used in place of bipolar transistors.

Operation of the present invention is described. The differential circuit is connected as a collector load to the emitter-grounded transistor in the inputting stage, and the reference voltage is supplied to one of the differential inputs of the differential circuit while a voltage corresponding to the output voltage of the front-end amplification circuit is supplied to the other differential input of the differential circuit. The collector resistors of the differential pair transistors of the differential circuit are set so as to have different resistance values from each other. Since the gain of the circuit is determined by the collector resistors, if the resistance values of the collector resistors are set to suitable values, then the gain when a high input power is inputted can be lowered. Consequently, the gain margin which indicates a degree of stability of the feedback circuit can be controlled to a high value, and stability of the circuit can be achieved.

DETAILED DESCRIPTION OF THE PREFERRED EMBODIMENTS

Embodiments of the preset invention are described below with reference to the drawings.

Figure 4:
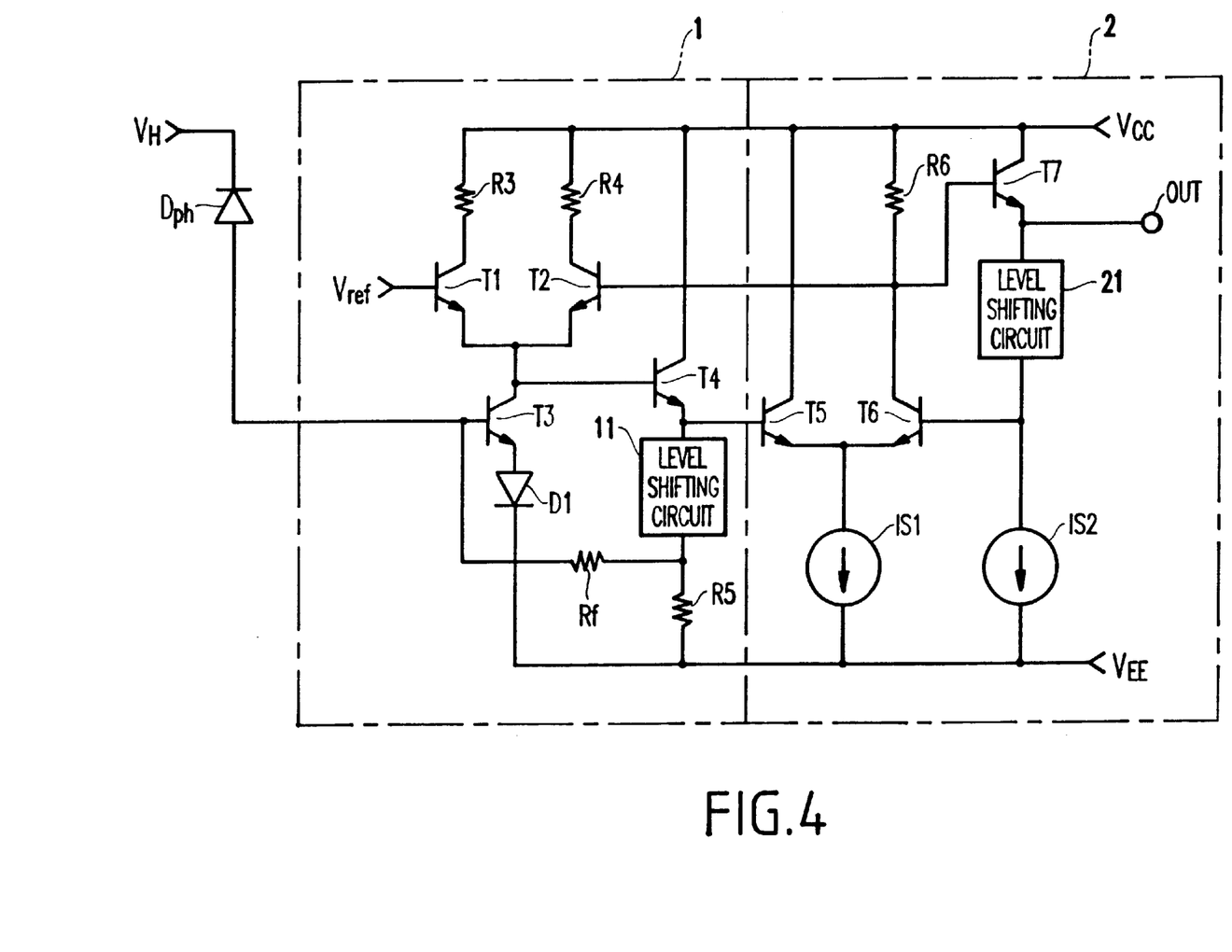
FIG. 4 is a circuit diagram showing an embodiment of the present invention.

FIG. 4 is a circuit diagram showing an embodiment of the present invention, which includes core amplification section 1 and outputting circuit section 2. Photo-current of light receiving element Dph flows through feedback resistance element Rf connected to the base of input stage emitter-grounded transistor T3, which composes core amplification section 1, into core amplification section 1, by which it is converted into a voltage. The conversion voltage is extracted as output OUT by output stage emitter follower transistor T7 of outputting circuit section 2.

The voltage corresponding to this output OUT is fed back to core amplification section 1. As this feedback circuit, a differential circuit including differential pair transistors T1, T2 and collector resistors R3, R4 having different resistance values from each other may be used. Reference voltage Vref is supplied to the base of transistor T1 of the differential circuit, and a base input to output stage transistor T7 of outputting circuit section 2 is supplied to the base of transistor T2. The differential circuit functions as a collector load to input stage emitter-grounded transistor T3, and to this end, an emitter common junction of differential pair transistors T1, T2 is connected to the collector of transistor T3.

The collector output of transistor T3 is supplied as a base input to transistor T4, and the emitter output of transistor T4 is supplied as a base input to one transistor T5 of the differential amplification circuit of outputting circuit section 2. In FIG. 4, reference symbol D1 denotes a level shifting diode, 11 a level shifting circuit, Rf a feedback resistor, and R5 an emitter resistor.

The output voltage of collector resistor R6 of the other transistor T6 of the differential amplification circuit of outputting circuit section 2 is supplied to the base of outputting stage transistor T7 and is simultaneously fed back to the base of transistor T2 in such a manner as described above. Further, reference symbol 21 denotes a level shifting circuit, and Is1, Is2 each denote a current source.

In the embodiment having such a construction as described above, an inputted optical signal is converted into photo-current by light receiving element Dph. The photo-current flows through feedback resistance element Rf into core amplification section 1, by which it is voltage/current converted. The thus converted voltage passes from the emitter of transistor T4 through transistors T5 to T7 and is extracted as output OUT from the emitter transistor T7. Further, this voltage is fed back to the base of transistor T2 of core amplification section 1.

Here, transistors T1, T2 compose a differential circuit, and the relationship between resistors R3 and R4 is set so as to satisfy $$R4 > R3$$

Figure 5:
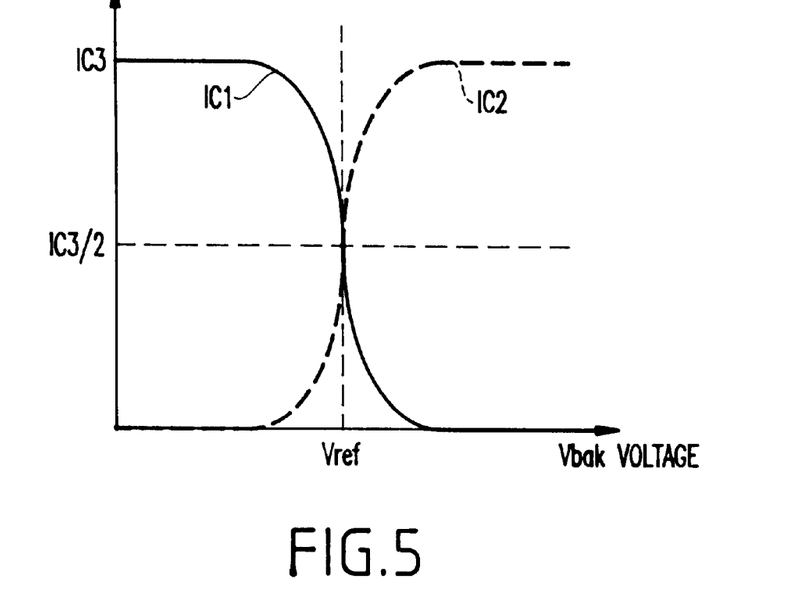
FIG. 5 is a diagram illustrating a relationship between collector currents Ic1, Ic2 flowing through transistors T1, T2 of the circuit of FIG. 4 and base voltage Vbak of transistor T2.

FIG. 5 shows a relationship between currents Ic1, Ic2 flowing through transistors T1, T2 and base voltage Vbak of transistor T2. Base reference voltage Vref of transistor T1 is set so that, when there is no optical input to light receiving element Dph, the following expression $$Vbak \gg Vref$$

may be satisfied. In particular, when there is no optical input power, transistor T2 exhibits an on state and transistor T1 exhibits an off state, and current Ic3 flowing through transistor T3 and current Ic2 flowing through transistor T2 are substantially equal to each other. On the other hand, when there is a high optical input power, transistor T1 exhibits an on state and transistor T2 exhibits an off state, and consequently, currents Ic1 and Ic3 flowing through transistors T1 and T3 are substantially equal to each other.

Figure 6:
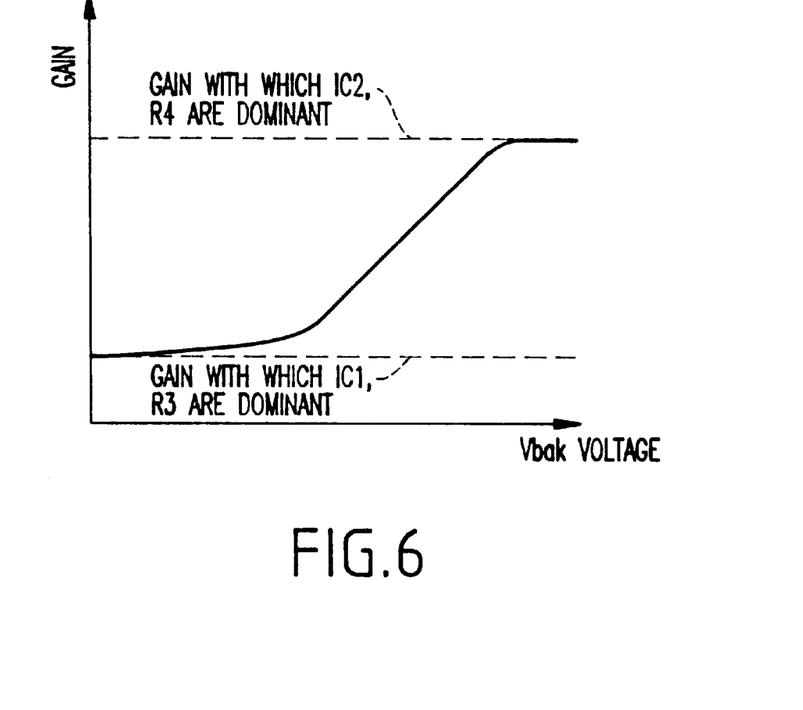
FIG. 6 is a diagram illustrating a relationship between the gain of core amplification section 1 of the circuit of FIG. 4 and base voltage Vbak of transistor T2.

FIG. 6 shows a relationship between the gain of core amplification section 1 and base voltage Vbak of transistor T2. The gain of core amplification section 1 depends upon a relative relationship between currents Ic1, Ic2 and resistors R3, R4. In particular, when there is no optical input power, the gain is dominated by current Ic2 and resistance R4. As the optical input increases, the output voltage decreases and also base voltage Vbak of transistor T2 drops. The gain of core amplification section 1 becomes dominated by current Ic1 and resistor R3 and the gain decreases as voltage Vbak drops. In this instance, the characteristics vary in a direction in which the gain margin which indicates a degree of stability of the feedback circuit increases.

Figure 7A:
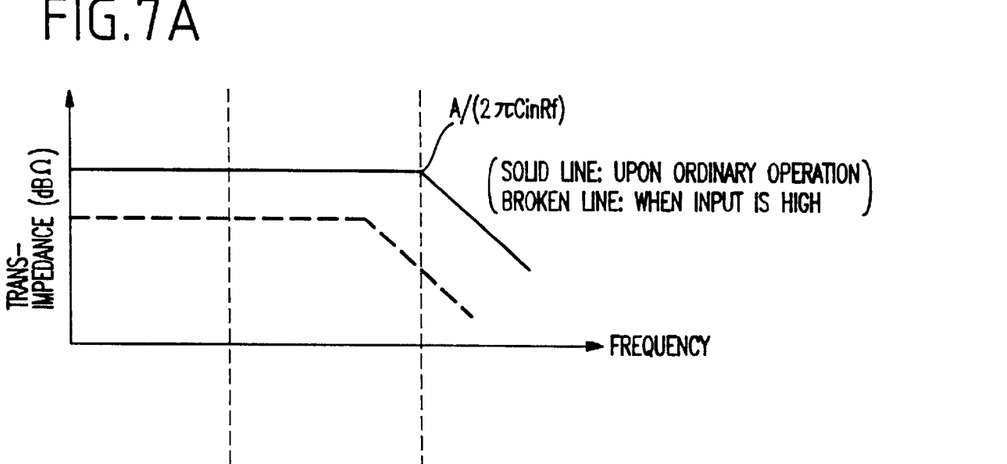
FIGS. 7A, 7B and 7C are diagrams showing a frequency characteristic, an open loop gain band characteristic and a no-feedback gain band characteristic of the core amplification section of the circuit of FIG. 4, respectively.
Figures 7B, 7C:
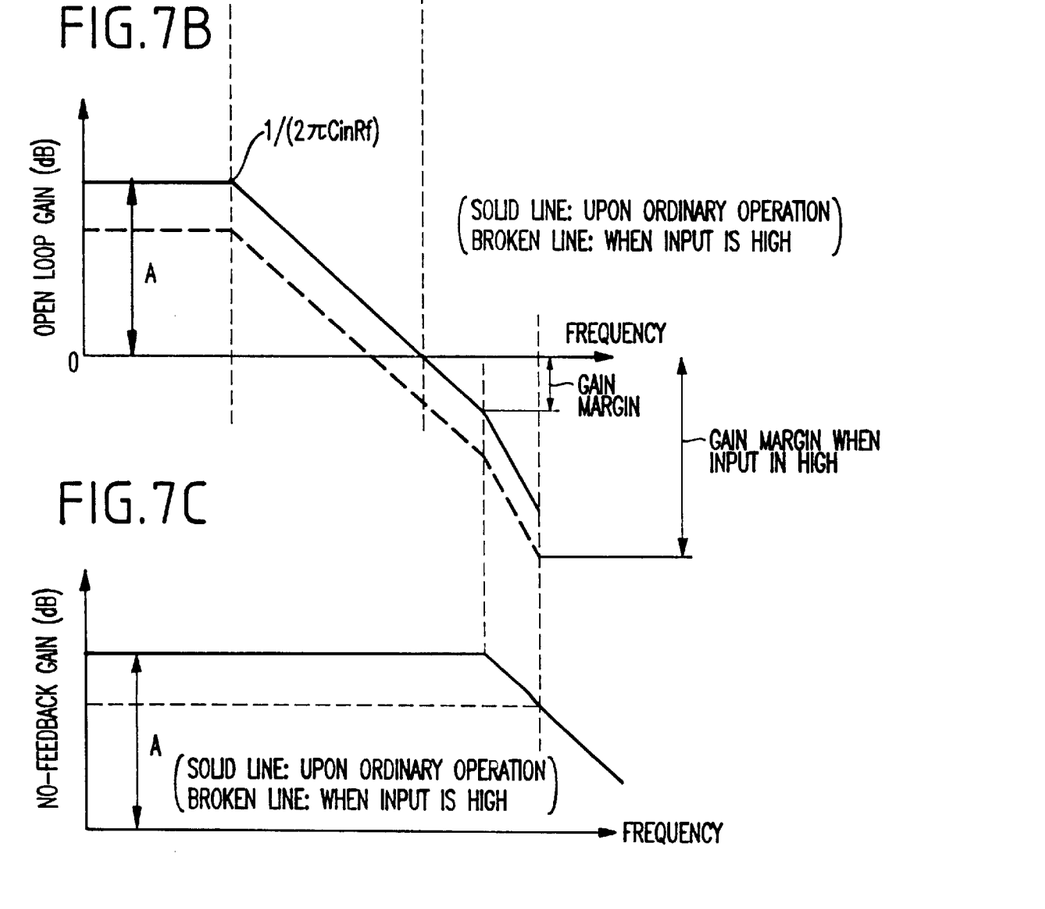

A frequency characteristic, an open loop gain band characteristic and a no-feedback gain band characteristic of the core amplification section of the circuit described above are shown in FIGS. 7A, 7B and 7C. An operation when a high input power is received is equivalent to a decrease of the no-feedback gain shown in FIG. 7C, and consequently, the primary pole which indicates a no-feedback gain band moves to the higher frequency band side. Meanwhile, in the open gain band characteristic shown in FIG. 7B, since the gain moves to the decreasing side, the zero-cross point of the open loop gain moves to the lower frequency band side. Consequently, the gain margin which indicates a degree of stability of the feedback circuit increases, and the possibility of incomplete operation is reduced from that in ordinary operation.

Further, after transistor T1 enters an on state and transistor T2 enters an off state as a result of dropping of base voltage Vbak, since reference voltage Vref determines the collector voltage of transistor T1, a fixed voltage is outputted if a high input power higher than a fixed value is inputted.

Figure 8:
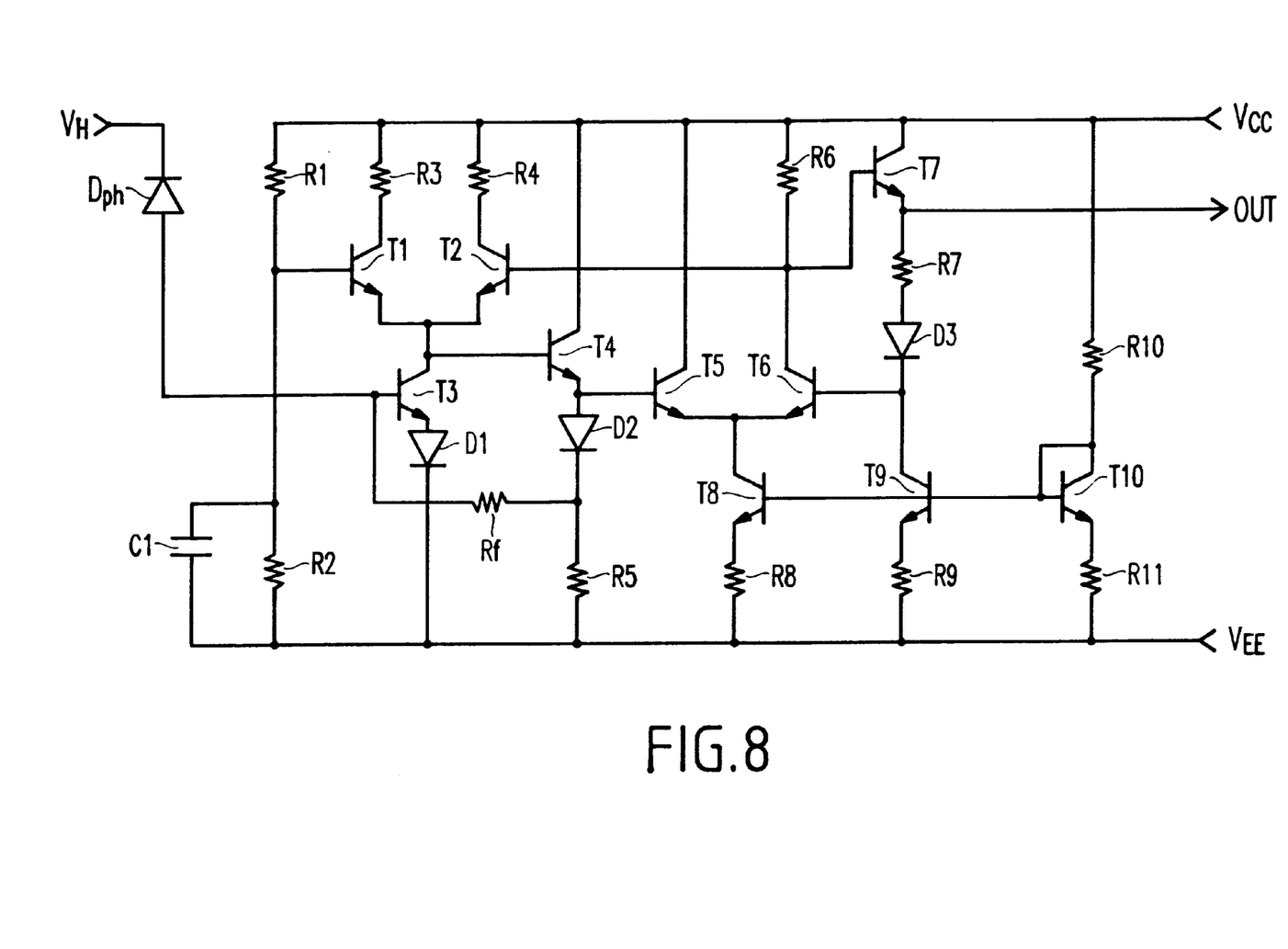
FIG. 8 is a circuit diagram showing an example of the circuit of the embodiment of the present invention.

FIG. 8 shows a detailed circuit example of the circuit of FIG. 4, and in FIG. 8, like elements are denoted by like reference symbols to those of FIG. 4. As base reference voltage Vref to transistor T1 of the differential circuit, a divided voltage obtained by a voltage dividing circuit formed from resistors R1, R2 is used. Capacitor C1 is provided in parallel to resistor R2 to stabilize the reference voltage.

Diode D2 composes level shifting circuit 11, and resistor R7 and diode D3 compose level shifting circuit 21. Current sources Is1, Is2 are composed of transistors T8 to T10, and resistors R8 to R11.

Figure 9:
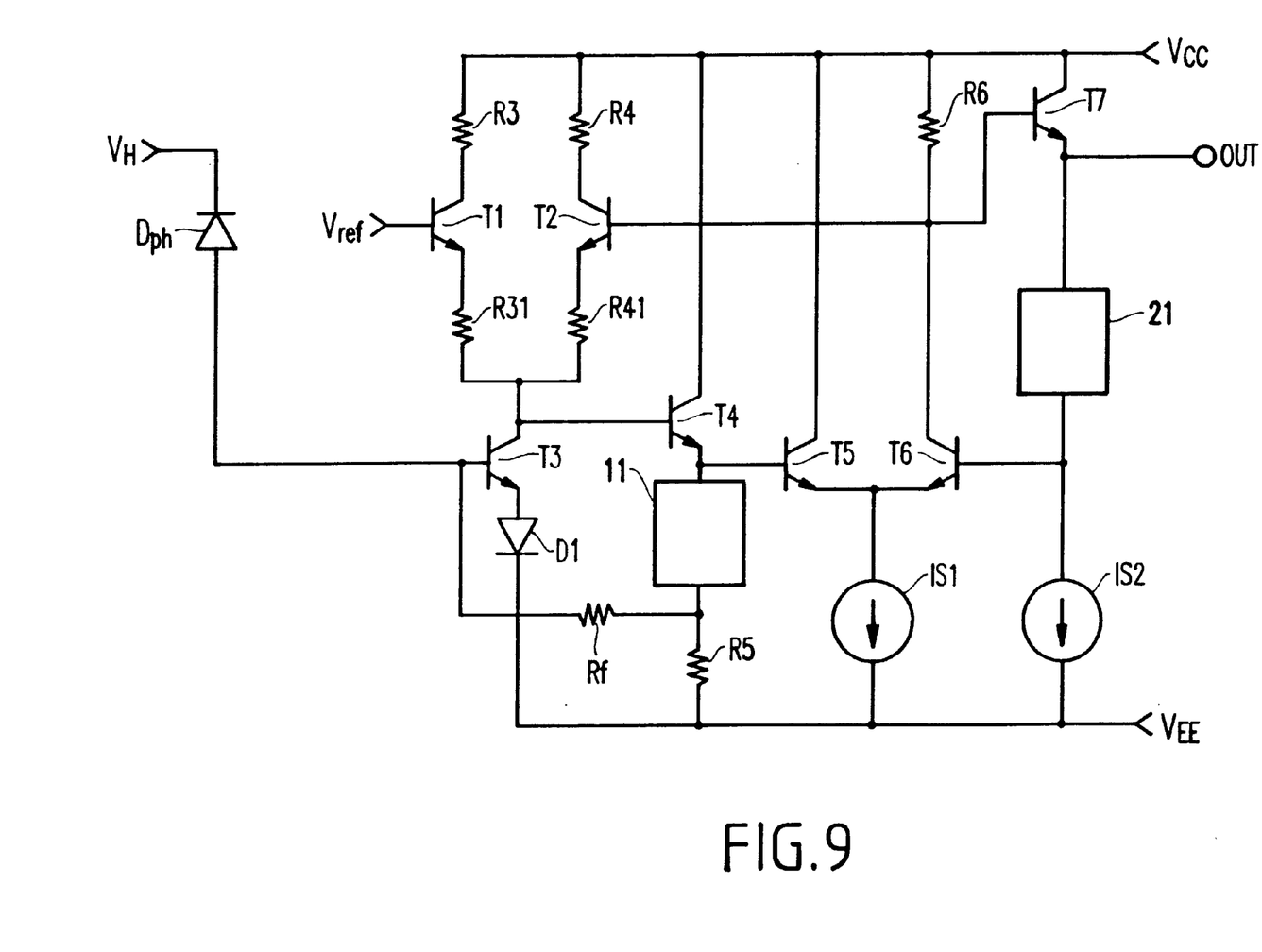
FIG. 9 is a circuit diagram showing another embodiment of the present invention.
Figure 10:
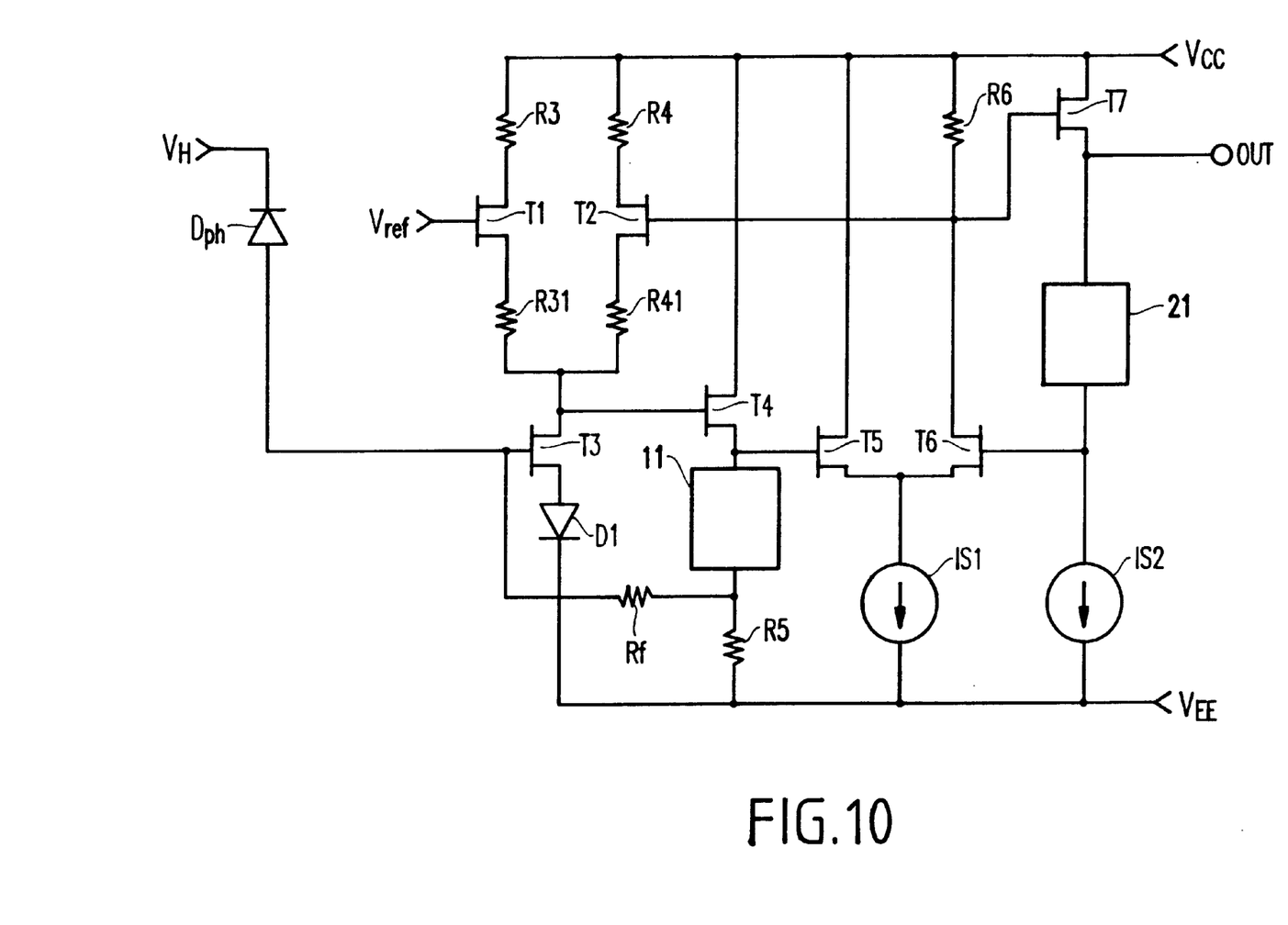
FIG. 10 is a circuit diagram showing a further embodiment of the present invention.

FIG. 9 is a circuit diagram showing another embodiment of the present invention, in which resistors R31, R41 are inserted in the emitters of transistors T1, T2 of the differential circuit of FIG. 4 to moderate the gain variation of the core amplification section with respect to a variation of base voltage Vbak. On the other hand, FIG. 10 shows a further embodiment wherein, as the transistors which compose the circuit of FIG. 9, FETs (field effect transistors) transistors are used in place of bipolar transistors. Also for the circuit of FIG. 4, FETs can be used naturally.

As described above, according to the present invention, since the gain of the core amplification section is lowered when a high input power is inputted, the band of the core amplification section expands and the transimpedance gain band drops, and consequently, their poles move away from each other. Accordingly, the present invention is advantageous in that the stability of the feedback circuit increases. Therefore, since it is only required to take the stability upon ordinary operation into consideration, the present invention is advantageous also in that designing of the feedback circuit is facilitated. Furthermore, since reference voltage Vref of the differential circuit determines the collector output voltage of the transistors, a fixed voltage can be outputted with respect to a high input power higher than a fixed value.

What is claimed is:

1. A front-end amplification circuit, comprising:
   an emitter-grounded transistor to a base of which an output of a light receiving element is supplied;
   a collector-grounded transistor to a base of which an output of a collector of said emitter-grounded transistor is inputted;
   a feedback resistor for feeding back an output of said collector-grounded transistor to the base of said emitter-grounded transistor;
   an outputting circuit for extracting an output voltage corresponding to an output of an emitter of said collector-grounded transistor; and
   a differential circuit operating as a load to the collector of said emitter-grounded transistor, said differential circuit including differential pair transistors whose collector resistors are set so as to have different resistance values from each other, a reference voltage being supplied to one of a pair of differential inputs of said differential circuit while a voltage corresponding to the output voltage is supplied to the other of the differential inputs of said differential circuit.

2. A front-end amplification circuit as claimed in claim 1, wherein said differential circuit includes differential pair transistors whose emitters are connected in common, and the reference voltage is supplied to one of the bases of said differential pair transistors while the output voltage of said outputting circuit is supplied to the other base of said differential pair transistors.

3. A front-end amplification circuit as claimed in claim 1, wherein the resistance value of the resistor provided for the collector of the transistor to which the reference voltage is supplied is selected lower than the resistance value of the resistor provided for the collector of the other transistor.

4. A front-end amplification circuit as claimed in claim 2, wherein the resistance value of the resistor provided for the collector of the transistor to which the reference voltage is supplied is selected lower than the resistance value of the resistor provided for the collector of the other transistor.

5. A front-end amplification circuit as claimed in claim 1, wherein said outputting circuit comprises a differential amplification circuit to which the emitter output of said collector-grounded transistor is inputted, and an emitter follower transistor to a base of which an output of said differential amplification circuit is inputted, and an output of said emitter follower transistor is used as an output of said front-end amplification circuit and an output of said differential amplification circuit is supplied to one of the bases of said differential pair transistors.

6. A front-end amplification circuit as claimed in claim 2, wherein said outputting circuit comprises a differential amplification circuit to which the emitter output of said collector-grounded transistor is inputted, and an emitter follower transistor to a base of which an output of said differential amplification circuit is inputted, and an output of said emitter follower transistor is used as an output of said front-end amplification circuit and an output of said differential amplification circuit is supplied to the other base of said differential pair transistors.

7. A front-end amplification circuit as claimed in claim 3, wherein said outputting circuit comprises a differential amplification circuit to which the emitter output of said collector-grounded transistor is inputted, and an emitter follower transistor to a base of which an output of said differential amplification circuit is inputted, and an output of said emitter follower transistor is used as an output of said front-end amplification circuit and an output of said differential amplification circuit is supplied to one of the bases of said differential pair transistors.

8. A front-end amplification circuit as claimed in claim 4, wherein said outputting circuit comprises a differential amplification circuit to which the emitter output of said collector-grounded transistor is inputted, and an emitter follower transistor to a base of which an output of said differential amplification circuit is inputted, and an output of said emitter follower transistor is used as an output of said front-end amplification circuit and an output of said differential amplification circuit is supplied to the other base of said differential pair transistors.

9. A front-end amplification circuit as claimed in claim 2, wherein said differential circuit further comprises resistors provided between emitters of said differential pair transistors and the collector of said emitter-grounded transistor.

10. A front-end amplification circuit as claimed in claim 3, wherein said differential circuit further comprises resistors provided between emitters of said differential pair transistors and the collector of said emitter-grounded transistor.

11. A front-end amplification circuit as claimed in claim 4, wherein said differential circuit further comprises resistors provided between emitters of said differential pair transistors and the collector of said emitter-grounded transistor.

12. A front-end amplification circuit as claimed in claim 5, wherein said differential circuit further comprises resistors provided between emitters of said differential pair transistors and the collector of said emitter-grounded transistor.

13. A front-end amplification circuit as claimed in claim 6, wherein said differential circuit further comprises resistors provided between emitters of said differential pair transistors and the collector of said emitter-grounded transistor.

14. A front-end amplification circuit as claimed in claim 7, wherein said differential circuit further comprises resistors provided between emitters of said differential pair transistors and the collector of transmitter-grounded transistor.

15. A front-end amplification circuit as claimed in claim 8, wherein said differential circuit further comprises resistors provided between emitters of said differential pair transistors and the collector of said emitter-grounded transistor.

16. A front-end amplification circuit as claimed in claim 1, wherein, as said transistors, field effect transistors are used in place of bipolar transistors.

17. A front-end amplification circuit as claimed in claim 2, wherein, as said transistors, field effect transistors are used in place of bipolar transistors.

18. A front-end amplification circuit as claimed in claim 3, wherein, as said transistors, field effect transistors are used in place of bipolar transistors.

19. A front-end amplification circuit as claimed in claim 4, wherein, as said transistors, field effect transistors are used in place of bipolar transistors.

20. A front-end amplification circuit as claimed in claim 5, wherein, as said transistors, field effect transistors are used in place of bipolar transistors.

21. A front-end amplification circuit as claimed in claim 6, wherein, as said transistors, field effect transistors are used in place of bipolar transistors.

22. A front-end amplification circuit as claimed in claim 7, wherein, as said transistors, field effect transistors are used in place of bipolar transistors.

23. A front-end amplification circuit as claimed in claim 8, wherein, as said transistors, field effect transistors are used in place of bipolar transistors.

24. A front-end amplification circuit as claimed in claim 9, wherein, as said transistors, field effect transistors are used in place of bipolar transistors.

25. A front-end amplification circuit as claimed in claim 10, wherein, as said transistors, field effect transistors are used in place of bipolar transistors.

26. A front-end amplification circuit as claimed in claim 11, wherein, as said transistors, field effect transistors are used in place of bipolar transistors.

27. A front-end amplification circuit as claimed in claim 12, wherein, as said transistors, field effect transistors are used in place of bipolar transistors.

28. A front-end amplification circuit as claimed in claim 13, wherein, as said transistors, field effect transistors are used in place of bipolar transistors.

29. A front-end amplification circuit as claimed in claim 14, wherein, as said transistors, field effect transistors are used in place of bipolar transistors.

30. A front-end amplification circuit as claimed in claim 15, wherein, as said transistors, field effect transistors are used in place of bipolar transistors.

* * * * *